United States Patent
Kwack et al.

(10) Patent No.: US 8,367,436 B2
(45) Date of Patent: Feb. 5, 2013

(54) ORGANIC LIGHT EMITTING DIODE DISPLAY AND MANUFACTURING METHOD THEREFOR

(75) Inventors: Jin-Ho Kwack, Yongin (KR); Dae-Beom Shin, Yongin (KR); Dong-Hun Kang, Yongin (KR); Hyo-Jin Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/052,369

(22) Filed: Mar. 21, 2011

(65) Prior Publication Data

US 2011/0291117 A1  Dec. 1, 2011

(30) Foreign Application Priority Data

May 28, 2010 (KR) .................. 10-2010-0050492

(51) Int. Cl.
*H01L 21/00* (2006.01)

(52) U.S. Cl. ................................................ 438/26
(58) Field of Classification Search ............. 438/26
See application file for complete search history.

(56) References Cited

U.S. PATENT DOCUMENTS

| 2005/0127371 A1* | 6/2005 | Yamazaki et al. ........... 257/72 |
| 2009/0069164 A1* | 3/2009 | Lamberson et al. ......... 501/15 |
| 2010/0123150 A1 | 5/2010 | Anandan |

FOREIGN PATENT DOCUMENTS

| JP | 2005-339863 | 12/2005 |
| KR | 100796129 B1 | 1/2008 |
| KR | 1020080086038 A | 9/2008 |

* cited by examiner

*Primary Examiner* — Charles Garber
*Assistant Examiner* — Andre' C Stevenson
(74) *Attorney, Agent, or Firm* — Robert E. Bushnell, Esq.

(57) ABSTRACT

A manufacturing method of an organic light emitting diode (OLED) display device includes forming a thin film transistor and an organic light emitting diode in a display area of a first substrate, forming a thin film encapsulation layer that has a layering structure of an organic film and an inorganic film on one substrate of the first substrate and a second substrate, forming a sealing member by coating a sealing material that includes an inorganic sealant and an organic compound on an edge of the second substrate, removing the organic compound of the sealing member by baking the sealing member, layering the second substrate on the first substrate so that the sealing member contacts the first substrate, dissolving the sealing member by using a laser beam, solidifying the sealing member, attaching the sealing member to the first substrate, and removing the second substrate from the sealing member.

23 Claims, 13 Drawing Sheets

ORGANIC LIGHT EMITTING DIODE DISPLAY AND MANUFACTURING METHOD THEREFOR

CLAIM OF PRIORITY

This application makes reference to, incorporates the same herein, and claims all benefits accruing under 35 U.S.C. §119 from an application earlier filed in the Korean Intellectual Property Office on the 28$^{th}$ of May 2010 and there duly assigned Serial No. 10-2010-0050492.

BACKGROUND OF THE INVENTION

1. Field of the Invention

The described technology relates generally to an organic light emitting diode (OLED) display device, and more particularly, to an organic light emitting diode (OLED) display device to which a thin film encapsulation (TFE) technology is applied and a manufacturing method thereof.

2. Description of the Related Art

An organic light emitting diode (OLED) display device is a self light emitting display device that displays an image by using an organic light emitting diode that emits light from the organic light emitting diode itself.

The above information disclosed in this Background section is only for enhancement of understanding of the background of the described technology and therefore it may contain information that is not prior art or that is not already known in this country to a person of ordinary skill in the art.

SUMMARY OF THE INVENTION

It is an aspect of the present invention to provide an improved organic light emitting diode (OLED) display device and an improved method for manufacturing the organic light emitting diode (OLED) display device.

It is another aspect of the present invention to provide an organic light emitting diode (OLED) display device to which a thin film encapsulation technology is applied, which can suppress deterioration of the organic light emitting diode so that external moisture and oxygen cannot permeate the organic light emitting diode, and a manufacturing method thereof.

According to one or more embodiments of the present invention, a manufacturing method of an organic light emitting diode (OLED) display device is provided. The method includes preparing a first substrate and a second substrate and forming a thin film transistor and an organic light emitting diode in a display area of the first substrate, forming a thin film encapsulation layer that has a layering structure of an organic film and an inorganic film on one substrate of the first substrate and the second substrate, forming a sealing member by coating a sealing material that includes an inorganic sealant and an organic compound on an edge of the second substrate, removing the organic compound of the sealing member by baking the sealing member, layering the second substrate on the first substrate so that the sealing member contacts the first substrate, and dissolving the sealing member by using a laser beam, solidifying the sealing member, attaching the sealing member to the first substrate, and removing the second substrate from the sealing member.

The thin film encapsulation layer may be formed on an entirety of one surface of the second substrate. In this case, the manufacturing method of an organic light emitting diode (OLED) display device may further include forming a sacrificial layer between the second substrate and the thin film encapsulation layer.

The second substrate, the sacrificial layer and the thin film encapsulation layer may be formed in an area that is larger than the display area. The sacrificial layer may have a heat resistant temperature that corresponds to and is no less than the baking temperature of the sealing member and may include at least one of ceramic oxides, ceramic nitrides, organic polymers and metal.

The manufacturing method of an organic light emitting diode (OLED) display device may further include forming a heat resistant member between the sacrificial layer and the thin film encapsulation layer. The heat resistant member may have a heat resistant temperature that corresponds to and is no less than the baking temperature of the sealing member, and may include at least one of polyimide, polyphenylsulphide, polyethersulfone and polyethyleneterephthalate. The sealing member may be formed at an edge of the thin film encapsulation layer on the thin film encapsulation layer.

The manufacturing method of an organic light emitting diode (OLED) display device may further include, after the organic light emitting diode is formed on the first substrate, covering the display area with a protective layer. The protective layer may contact the thin film encapsulation layer after the sealing member is attached with the first substrate, and may be formed in an area that is the same as the display area or larger than the display area.

Meanwhile, the thin film encapsulation layer may be formed in an area that is larger than the display area on the organic light emitting diode. In this case, the manufacturing method of an organic light emitting diode (OLED) display device may further include forming a sacrificial layer and heat resistant member between the second substrate and the sealing member.

The distance between interior walls of the sealing member may be smaller than the width of the thin film encapsulation layer, and the distance between exterior walls of the sealing member may be larger than the width of the thin film encapsulation layer. The baking temperature of the sealing member may be within a range that extends from approximately 400° C. to approximately 450° C.

The laser beam may include a first laser beam that is irradiated to the sacrificial layer to separate the second substrate from the sacrificial layer and a second laser beam that is irradiated to the sealing member to dissolve the sealing member.

According to another embodiment of the present invention, an organic light emitting diode (OLED) display device may be constructed with a first substrate that includes a display area in which an organic light emitting diode is formed, a thin film encapsulation layer that is disposed at an external side of the organic light emitting diode along a thickness direction of the first substrate and has a layering structure of at least one organic film and at least one inorganic film, a sealing member that contacts the thin film encapsulation layer and is disposed at the external side of the organic light emitting diode along a surface direction of the first substrate, and a sacrificial layer that is disposed on an upper portion of any one of the thin film encapsulation layer and the sealing member.

The sealing member may be formed on the first substrate, and the thin film encapsulation layer may be disposed to be spaced apart from the organic light emitting diode on the sealing member. The sacrificial layer may be disposed on the thin film encapsulation layer while having an area that is the same as an area of the thin film encapsulation layer. The organic light emitting diode (OLED) display device may further include a heat resistant member that is disposed between the sacrificial layer and the thin film encapsulation layer while having an area that is the same as the area of the thin film encapsulation layer.

The organic light emitting diode (OLED) display device may further include a protective layer that is disposed in an internal space that is surrounded by the thin film encapsulation layer and the sealing member and the first substrate. The protective layer may contact the organic light emitting diode.

Meanwhile, thin film encapsulation layer may be formed to contacted the organic light emitting diode on the first substrate, and the sealing member may cover an edge of the thin film encapsulation layer. The sacrificial layer may be disposed on the sealing member while having an area that is the same as an area of the sealing member. The organic light emitting diode (OLED) display device may further include a heat resistant member that is disposed between the sacrificial layer and the sealing member while having an area that is the same as the area of the sealing member.

The thin film encapsulation layer may be formed in an area that is larger than the display area, and the distance between interior walls of the sealing member may be smaller than the width of the thin film encapsulation layer, and the distance between exterior walls of the sealing member may be larger than the width of the thin film encapsulation layer.

According to the principles of the present invention, it is possible to suppress permeation of external moisture and oxygen with respect to the organic light emitting diode by using a combination of the thin film encapsulation layer and the sealing member. Accordingly, the organic light emitting diode (OLED) display device constructed according to these principles can prevent display defects by suppressing the deterioration of the organic light emitting diodes. In addition, since the baking of the sealing member is performed on the second substrate instead of the first substrate, the dense sealing member can be formed by increasing a laser absorption ratio of the sealing member, and as a result thereof, it is possible to increase attachment performance and sealing performance of the sealing member.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1A:
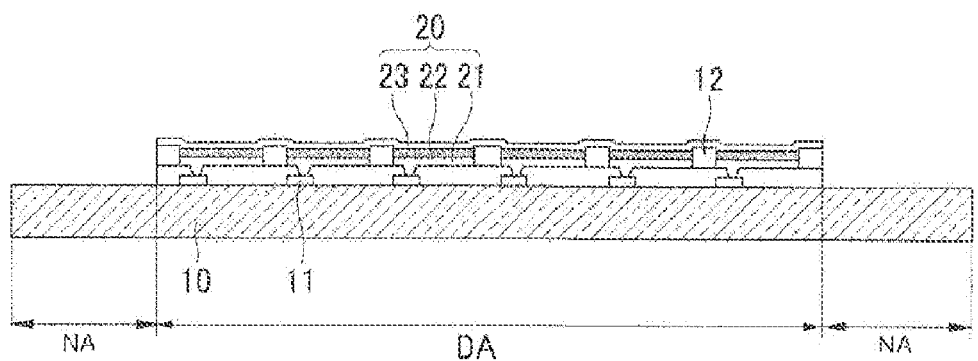
FIG. 1A to FIG. 1D are cross-sectional views that illustrate a manufacturing method of an organic light emitting diode (OLED) display device as a first embodiment according to the principles of the present invention.

An organic light emitting diode includes a hole injection electrode, an organic emission layer and an electron injection electrode, and emits light by energy that is generated when an exciton that is formed by combining electrons and holes in an organic emission layer falls from the exited state to the normal state.

Deterioration of an organic light emitting diode may be caused by both internal factors and external factors. The deterioration that is caused by the internal factor may include deterioration of the organic emission layer due to oxygen from indium tin oxide (ITO) that is used as an electrode material and the like. The deterioration that is caused by external factors includes deterioration that is due to permeation of external moisture and oxygen or ultraviolet (UV) and the like. Particularly, the deterioration that is caused by this external factor fatally affects the life-span of the organic light emitting diode. Therefore, a packaging technology that seals the organic light emitting diode is very important.

Among the packaging technologies of the organic light emitting diode, a thin film encapsulation (TFE) technology is known. The thin film encapsulation technology is a technology that covers the display area of the substrate by a thin film encapsulation layer by alternately layering one or more inorganic films and organic films on the organic light emitting diodes. The thin film encapsulation layer is essential to implement a slim organic light emitting diode (OLED) display device to which a thin film substrate is applied and a flexible organic light emitting diode (OLED) display device in which a substrate is formed by a flexible film.

The above thin film encapsulation layer is effective to suppress permeation of moisture and oxygen in a thickness direction, but is poor to suppress permeation of moisture and oxygen along a surface direction of the thin film encapsulation layer at an edge thereof. Therefore, at the edge of the thin film encapsulation layer, moisture and oxygen may permeate, and in the process of driving the organic light emitting diode (OLED) display device, the organic light emitting diodes that are disposed at the edge of the display area may be deteriorated, such that display defects may be undesirably generated.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Figure 10:
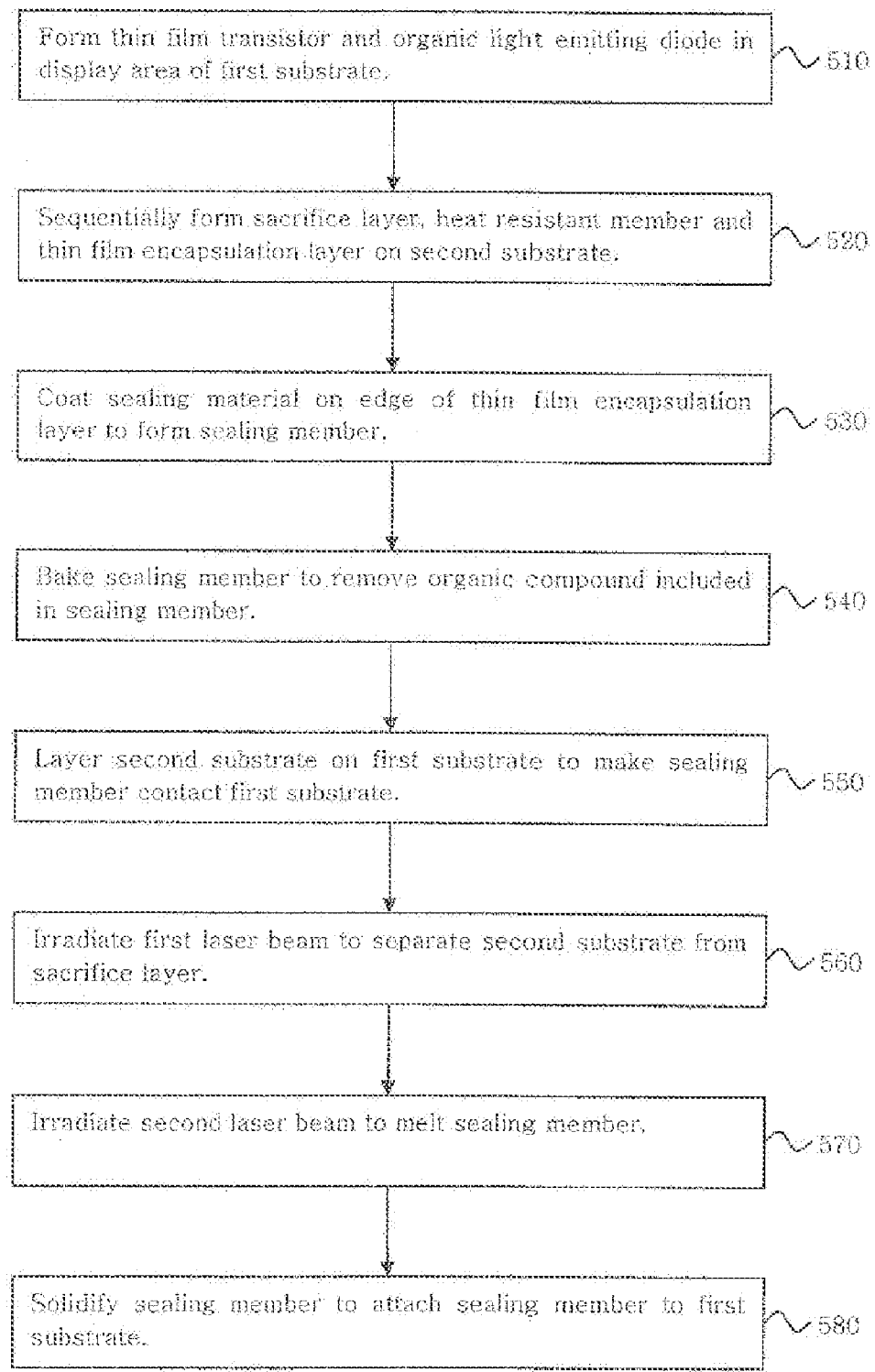
FIG. 10 is a flow chart illustrating the method for manufacturing the organic light emitting diode (OLED) display device as the first embodiment according to the principles of the present invention.

FIGS. 1A to FIG. 1D are cross-sectional views that illustrate a manufacturing method of an organic light emitting diode (OLED) display device as a first embodiment according to the principles of the present invention. FIG. 10 is a flow chart illustrating the manufacturing method of the organic light emitting diode (OLED) display device as the first embodiment according to the principles of the present invention.

Referring to FIG. 1A, a driving circuit portion and organic light emitting diode 20 are formed on display area DA of first substrate 10 (step 510). Display area DA includes a plurality of pixels, and the driving circuit portion and organic light emitting diode 20 are disposed for each pixel. The pixel is formed of one sub pixel or a plurality of sub pixels, and forms a minimum unit that displays an image. A non-display area NA that includes a sealing area, wire area and pad area is disposed at the external side of display area DA.

The driving circuit portion includes at least two thin film transistors (switching thin film transistor and driving thin film transistor) and at least one capacitor. In FIG. 1A, the driving circuit portion is schematically illustrated, in which one thin film transistor 11 is disposed for each pixel.

Organic light emitting diode 20 includes pixel electrode 21, organic emission layer 22 and common electrode 23. A pixel electrode 21 is formed for each pixel. Pixel electrode 21 is electrically connected to thin film transistor 11 of the corresponding pixel. Common electrode 23 is formed commonly over a plurality of pixels. Pixel electrode 21 may be a hole injection electrode, and common electrode 23 may be an electron injection electrode. In FIG. 1A, reference numeral 12 shows a pixel defining film that partitions organic emission layer 22 for defining pixels.

In display area DA, various organic layers in addition to organic emission layer 22 are disposed, and a phenomenon may occur in which a characteristic thereof is deteriorated when the organic layers are combined with moisture or oxygen. FIG. 1A schematically illustrates display area DA and a detailed structure of display area DA will be described later.

Figure 1B:
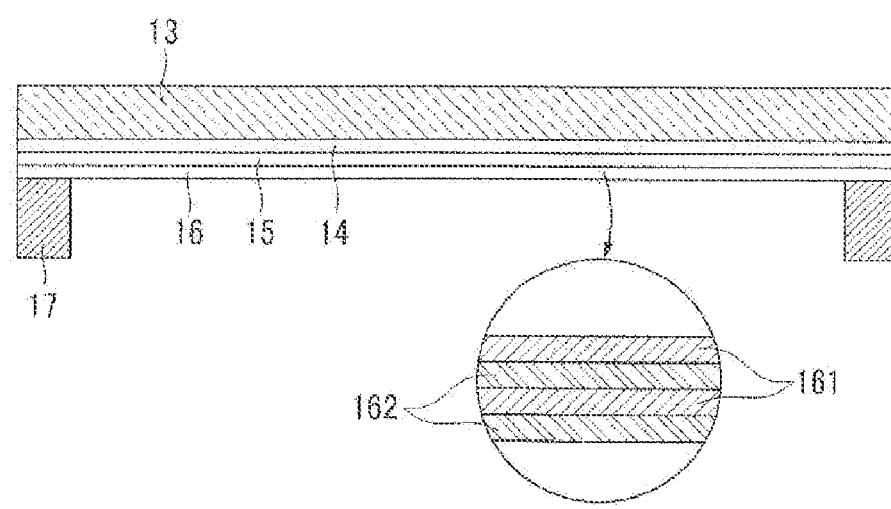

Referring to FIG. 1B, sacrificial layer 14, heat resistant member 15 and thin film encapsulation layer 16 are sequentially formed on second substrate 13 (step 520). Second substrate 13, sacrificial layer 14, heat resistant member 15 and thin film encapsulation layer 16 are formed in an area that is larger than the area of display area DA of first substrate 10.

Second substrate 13 is a transparent substrate through which a laser beam permeates, and may be, for example, a transparent glass substrate. Sacrificial layer 14 may be expressed by a separate layer, and is a layer that has deteriorated adherence with respect to second substrate 13 by heat of the laser beam. Sacrificial layer 14 may include at least one of ceramic oxides, ceramic nitrides, organic polymers and metal that satisfy these characteristics.

As the ceramic oxides, silicon oxides, titanium oxides and zirconium oxides may be used, and as the ceramic nitrides, silicon nitrides, aluminum nitrides, and titanium nitrides may be used. As the organic polymers, polyimide or polyphenylene sulfide may be used, and as the metal, a mixture of aluminum, lithium, titanium, manganese and tin and amorphous silicon may be used.

Heat resistant member 15 is used as a supporter that supports thin film encapsulation layer 16, and may be formed in a predetermined thickness on sacrificial layer 14. Heat resistant member 15 is formed of a high temperature heat resistant material that is not deformed at a baking temperature of sealing member 17 that will be described later. Heat resistant member 15 may be formed of a polymer material that has a high heat resistant temperature, for example, any one of polyimide, polyphenylene sulfide, polyethersulfone and polyethyleneterephthalate, and may be formed by using a spin coating method on sacrificial layer 14.

Thin film encapsulation layer 16 has a layered structure of inorganic film and organic film that include at least one inorganic film and at least one organic film. An enlarged circle of FIG. 1B shows a detailed structure of thin film encapsulation layer 16. In FIG. 1B, for example, two inorganic films 161 and two organic films 162 are alternately layered one by one to configure thin film encapsulation layer 16.

Inorganic film 161 may be formed of aluminum oxides or silicon oxides, and organic film 162 may be formed of any one of epoxy, acrylate and urethaneacrylate. In the completed organic light emitting diode (OLED) display device, inorganic film 161 suppresses the permeation of moisture and oxygen from the outside, and organic film 162 relieves the internal stress of inorganic film 161 or fills the fine crack and pinhole of inorganic film 161.

Next, sealing member 17 is formed by coating a sealing material on the edge of thin film encapsulation layer 16 (step 530). The sealing material includes an inorganic sealant and an organic compound. The sealing material may be coated by using dispensing or screen printing, and in this case, along the edge of thin film encapsulation layer 16. The sealing material may be uniformly coated in a predetermined thickness and width. Sealing member 17 is coated at the position that corresponds to non-display area NA of first substrate 10 on second substrate 13.

The inorganic sealant may include at least one that is selected from the group consisting of $K_2O$, $Fe_2O_3$, $Sb_2O_3$, $ZnO$, $P_2O_6$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$ and $B_2O_3$. The organic compound makes the coating of the sealing material easy by providing the viscosity to the sealing material as the solvent or binder. The organic compound may include at least one of ethyl cellulose, nitrocellulose, and propyl hydroxide cellulose.

The organic compound that is included in sealing member 17 is removed by baking sealing member 17 (step 540). The baking temperature of sealing member 17 may be set in a range of approximately 400° C. to approximately 450° C. If the baking temperature of sealing member 17 is lower than 400° C., the organic compound remains in sealing member 17, and the remaining organic compound deteriorates the laser absorption ratio of sealing member 17, such that the melting of the sealing member 17 in the following steps is prevented. Meanwhile, if the baking temperature of sealing member 17 is higher than 450° C., heat resistant member 15 cannot endure the temperature and causes deformation.

Figure 1C:
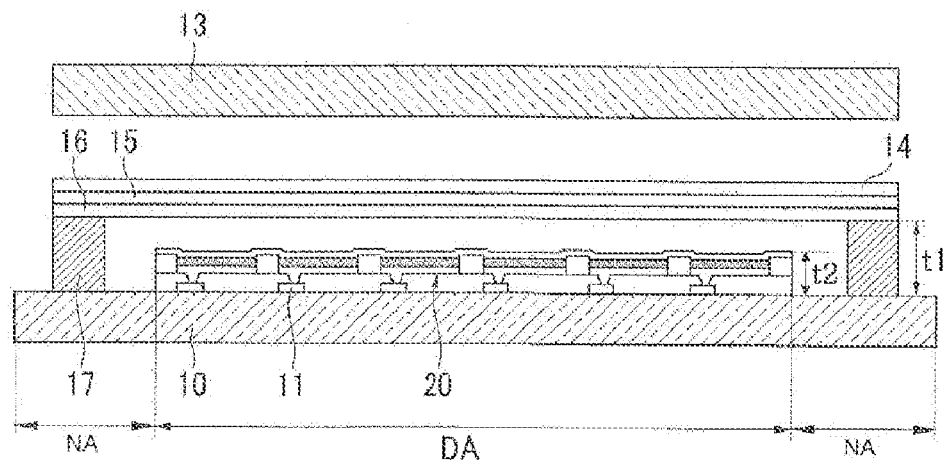
Figure 1D:
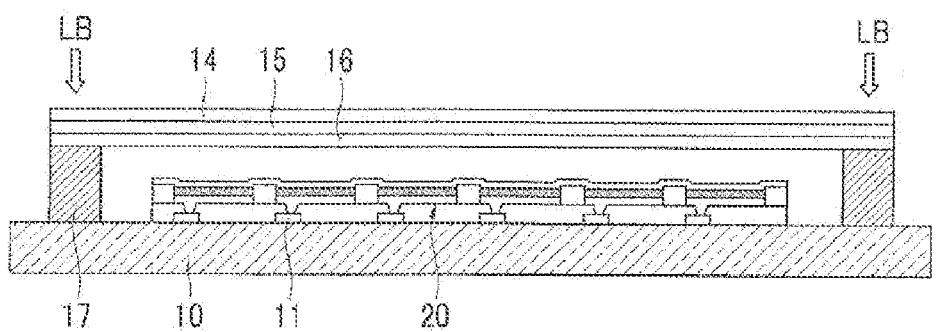

Referring to FIG. 1C, second substrate 13 is disposed on first substrate 10 so that sealing member 17 contacts first substrate 10 (step 550). Sealing member 17 surrounds display area DA while sealing member 17 is disposed to be spaced apart from display area DA by a predetermined distance. In this case, thickness t1 of sealing member 17 is larger than the entire thickness t2 of thin film transistor 11 and organic light emitting diode 20 that are provided in display area DA, and thin film encapsulation layer 16 is disposed to be spaced apart from organic light emitting diode 20 on first substrate 10.

Subsequently, heat is applied to sacrificial layer 14 by irradiating a first laser beam (laser beam for separation) from the upper portion of second substrate 13 to second substrate 13 (step 560). Then, the adherence between second substrate 13 and sacrificial layer 14 is deteriorated at the interface between second substrate 13 and sacrificial layer 14 due to the heat energy of the first laser beam. Second substrate 13 is separated from sacrificial layer 14. The first laser beam may be an excimer laser, carbonate gas laser, or helium-neon laser, and may be scanned in one direction from an end of second substrate 13 to the other end thereof.

Referring to FIG. ID, heat is applied to sealing member 17 by irradiating a second laser beam (laser beam for melting) LB from the upper portion of sacrificial layer 14 toward sealing member 17 (step 570). The second laser beam may scan sealing member 17 while moving along sealing member 17 from any one portion of sealing member 17 in a clockwise direction or counterclockwise direction.

After the inorganic sealant that constitutes sealing member 17 is melted by heat of the second laser beam, sealing member 17 is solidified at room temperature and firmly attached to first substrate 10 (step 580). That is, sealing member 17 that is melted and cooled is firmly attached to first substrate 10 and thin film encapsulation layer 16, thus combining and sealing first substrate 10 and thin film encapsulation layer 16. Thereby, thin film encapsulation layer 16 and heat resistant member 15 and sacrificial layer 14 at the upper portion thereof are firmly fixed to first substrate 10.

The second laser beam is neither absorbed on sacrificial layer 14 nor reflected by sacrificial layer 14, but absorbed on the inorganic sealant, and may have a wavelength of approximately 800 nm or more.

Meanwhile, in the above description, a process including first irradiating the first laser beam to separate sacrificial layer 14 from second substrate 13 and then irradiating the second laser beam to attach sealing member 17 to first substrate 10 is described, but an inverse process is possible. That is, after sealing member 17 is attached to first substrate 10 by irradiating the second laser beam, it is possible to separate second substrate 13 by irradiating the first laser beam.

Figure 2:
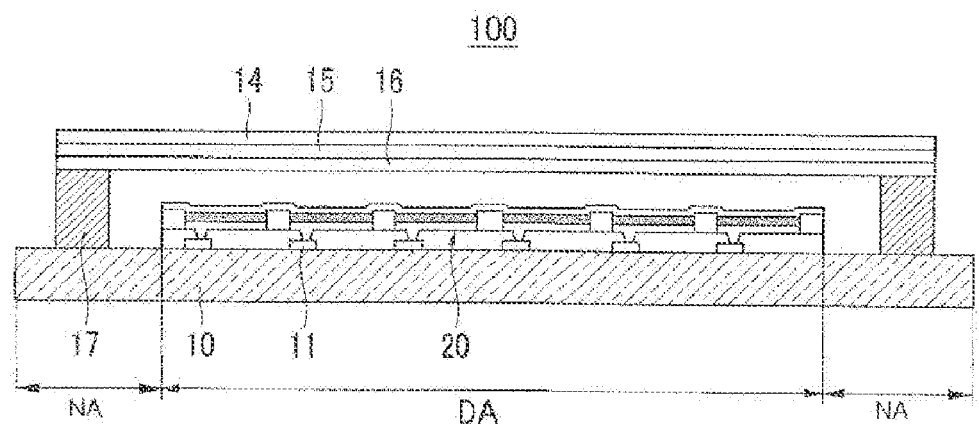
FIG. 2 is a cross-sectional view of an organic light emitting diode (OLED) display device constructed as the first embodiment according to the principles of the present invention.

FIG. 2 is a cross-sectional view of an organic light emitting diode (OLED) display device that is manufactured by using the above method as the first embodiment according to the principles of the present invention.

Referring to FIG. 2, display area DA on first substrate 10 is surrounded by thin film encapsulation layer 16 and sealing member 17 and sealed. Thin film encapsulation layer 16 does not directly cover display area DA but covers the upper portion of organic light emitting diode 20 and protects organic light emitting diode 20 while keeping a distance to display area DA along the thickness direction of first substrate 10. Sealing member 17 surrounds the edge of display area DA and protects organic light emitting diode 20.

Here, "the upper portion of the thin film encapsulation layer" is described on the basis of FIG. 2. According to the disposal state of first substrate 10, however, "the upper portion of the thin film encapsulation layer" may be variously expressed in such a way of "lower portion of the thin film encapsulation layer" or "rear portion of the thin film encapsulation layer". Thin film encapsulation layer 16 is supported by heat resistant member 15, and sacrificial layer 14 is disposed on heat resistant member 15.

Tin film encapsulation layer 16 has a large effect to suppress the permeation of moisture and oxygen in a thickness direction. Thereby, it is possible to efficiently suppress the permeation of moisture and oxygen that are applied from the upper portion of display area DA along the thickness direction of first substrate 10 by using thin film encapsulation layer 16. In addition, it is possible to efficiently suppress the permeation of moisture and oxygen that are applied from the side of display area DA along the direction (surface direction) that is parallel to one surface of first substrate 10 by using sealing member 17.

As a result, organic light emitting diode (OLED) display device 100 constructed as the first embodiment may suppress deterioration of organic light emitting diodes 20 to prevent display deterioration.

In organic light emitting diode (OLED) display device 100 constructed as the first embodiment, thin film encapsulation layer 16 is not directly formed on first substrate 10 but formed on heat resistant member 15, and thereafter thin film encapsulation layer 16 is fixed to first substrate 10 by sealing member 17. Accordingly, when thin film encapsulation layer 16 is formed, it is not necessary to consider the characteristic of thin film transistor 11 that is formed on display area DA, and there is no large limit to a material of thin film encapsulation layer 16 and a forming method thereof.

As the density of inorganic film 161 is increased, thin film encapsulation layer 16 shows an excellent sealing performance, and inorganic film 161 has the high density when inorganic film 161 is deposited at the high temperature. In the case of when thin film encapsulation layer 16 is directly deposited on first substrate 10, since it is impossible to increase the deposition temperature to 80° C. or more because of thin film transistor 11, the density of inorganic film 161 is low. On the other hand, since thin film encapsulation layer 16 of the first embodiment is formed on heat resistant member 15, inorganic film 161 can be formed at a deposition temperature of approximately 400° C. Organic light emitting diode (OLED) display device 100 according to the first embodiment can efficiently suppress the permeation of moisture by increasing the density of inorganic film 161.

In addition, as compared to the case of when thin film encapsulation layer 16 is directly formed on first substrate 10, the of inorganic film 161 and organic film 162 that constitutes thin film encapsulation layer 16 can be lowered. That is, thin film encapsulation layer 16 has excellent blocking efficiency along the thickness direction, and the permeation of moisture applied from the side of display area DA is prevented by sealing member 17, such that even though the of inorganic film 161 and organic film 162 is lowered, the same blocking effect can be implemented. For example, organic light emitting diode (OLED) display device 100 of the first embodiment may have two or three pairs of organic and inorganic films 162 and 161.

In addition, since sealing member 17 is baked on second substrate 13 instead of first substrate 10, it is possible to remove the organic compound that is included in sealing member 17 at high efficiency. Thereby, sealing member 17 with higher density may be formed by increasing the laser absorption ratio of sealing member 17, and as a result, it is possible to increase the attachment performance and sealing performance (i.e., the suppress performance of the permeation of moisture and oxygen) of sealing member 17.

If it is assumed that sealing member 17 is formed by directly coating a sealing material on first substrate 10, in the process for baking sealing member 17, since thin film transistor 11 and organic light emitting diodes 20 that are previously formed on first substrate 10 are broken, it is impossible to bake sealing member 17. Therefore, since a large amount of organic compound remains in sealing member 17 and deteriorates the laser absorption ratio, the attachment performance and sealing performance of sealing member 17 are deteriorated.

Figure 3:
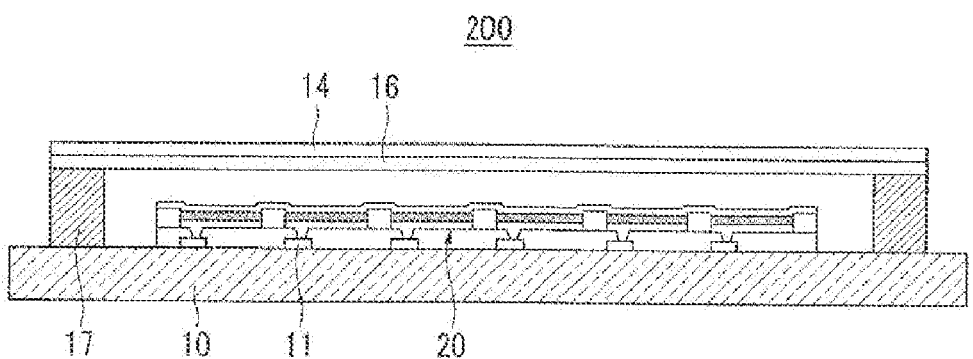
FIG. 3 is a cross-sectional view of an organic light emitting diode (OLED) display device constructed as a second embodiment according to the principles of the present invention.

FIG. 3 is a cross-sectional view of an organic light emitting diode (OLED) display device constructed as the second embodiment according to the principles of the present invention.

Referring to FIG. 3, organic light emitting diode (OLED) display device 200 of the second embodiment has the same configuration as the organic light emitting diode (OLED) display device of the first embodiment, except that the heat resistant member is omitted. In addition, the method of the second embodiment for manufacturing organic light emitting diode (OLED) display device 200 of the second embodiment includes the same steps as the manufacturing method of the first embodiment, except that the heat resistant member is omitted. Therefore, detailed explanation of the method of the second embodiment and a flowchart thereof is omitted.

In organic light emitting diode (OLED) display device 200 of the second embodiment, thin film encapsulation layer 16 contacts sacrificial layer 14, and sacrificial layer 14 is used as a support that supports thin film encapsulation layer 16. Sacrificial layer 14 is formed of the heat resistant material that is not deformed at the baking temperature (400° C. to 450° C.) of sealing member 17. Therefore, organic light emitting diode (OLED) display device 200 of the second embodiment can suppress deformation of thin film encapsulation layer 16 in the baking process of sealing member 17 even though it is not provided with the heat resistant member.

Figure 4A:
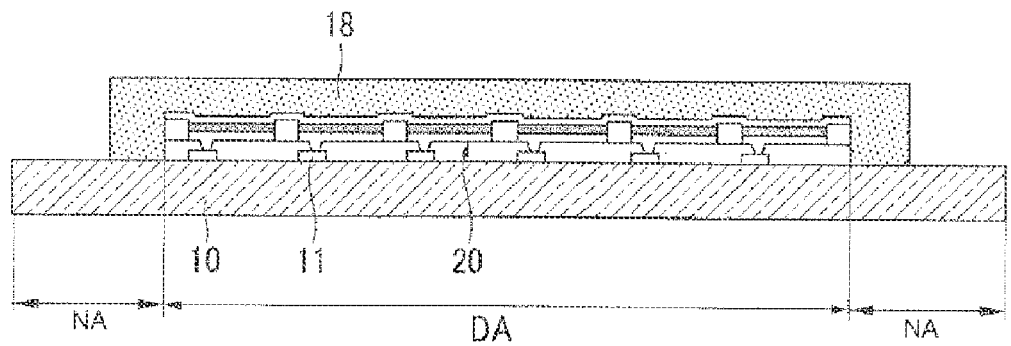
FIG. 4A to FIG. 4C are cross-sectional views that illustrate a method for manufacturing an organic light emitting diode (OLED) display device as a third embodiment constructed according to the principles of the present invention.
Figure 4B:
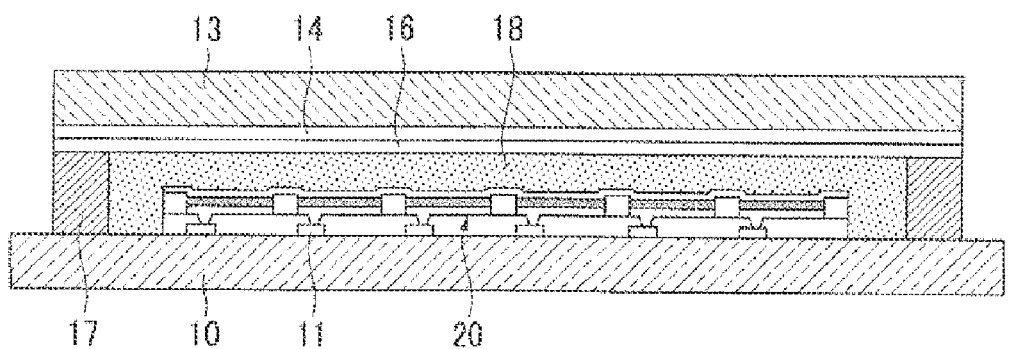
Figure 4C:
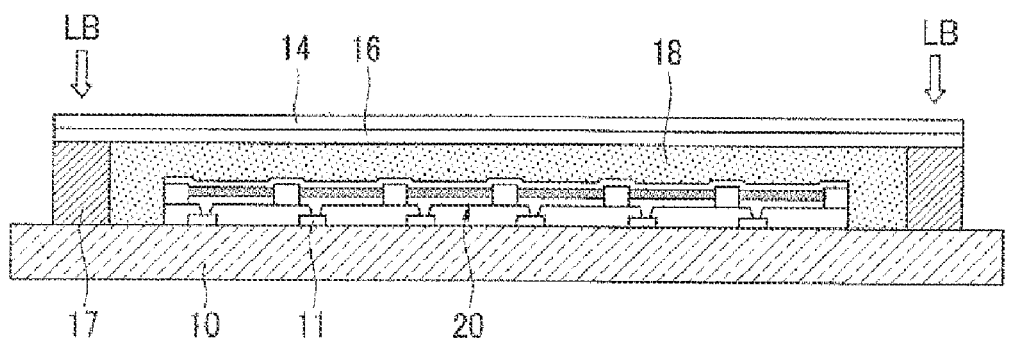
Figure 5:
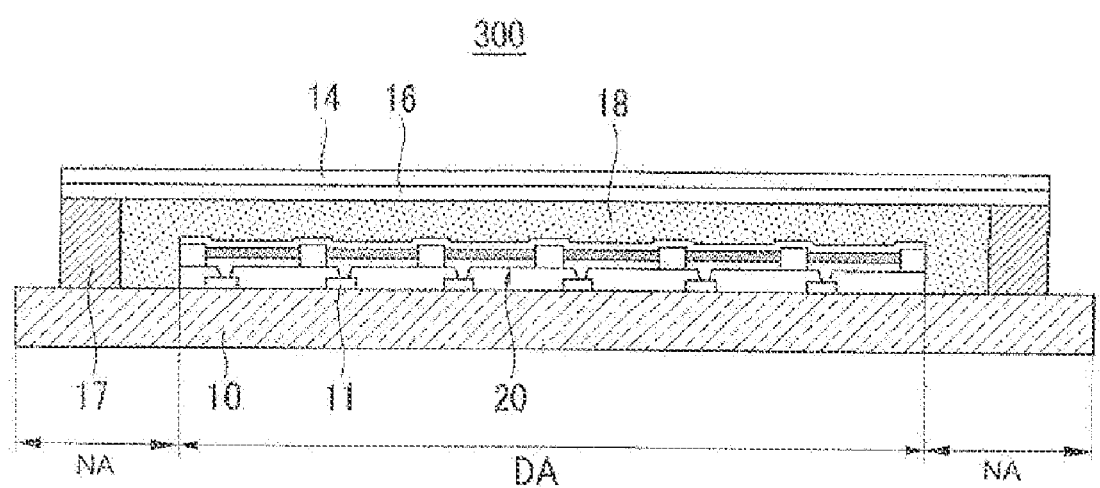
FIG. 5 is a cross-sectional view of an organic light emitting diode (OLED) display device constructed as the third embodiment according to the principles of the present invention.
Figure 11:
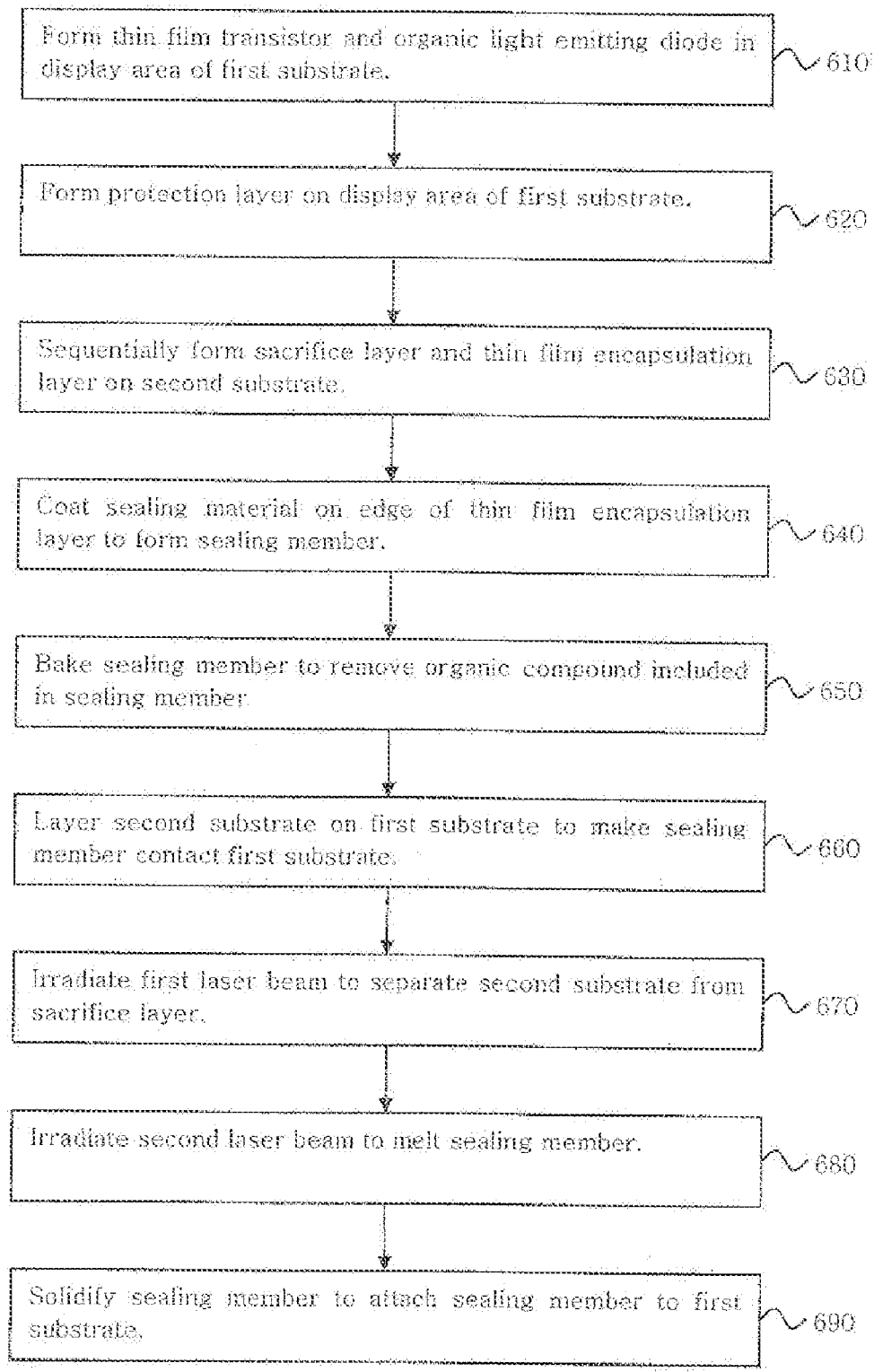
FIG. 11 is a flow chart illustrating the method for manufacturing the organic light emitting diode (OLED) display device as the third embodiment according to the principles of the present invention.

FIG. 4A to FIG. 4C are cross-sectional views that illustrate a manufacturing method of an organic light emitting diode (OLED) display device as a third embodiment according to the principles of the present invention, and FIG. 5 is a cross-sectional view of an organic light emitting diode (OLED) display device constructed as the third embodiment according to the principles of the present invention. FIG. 11 is a flow chart illustrating the manufacturing method of the organic light emitting diode (OLED) display device as the third embodiment according to the principles of the present invention.

Referring to FIG. 5, organic light emitting diode (OLED) display device 300 of the third embodiment has the same configuration as the organic light emitting diode (OLED) display device of the first embodiment, except that the heat resistant member is omitted and protective layer 18 is added. Hereinafter, the third embodiment will be described on the basis of the organic light emitting diode (OLED) display device of the first embodiment, manufacturing method of the first embodiment and the other contents.

Referring to FIG. 4A, after thin film transistor 11 and organic light emitting diode 20 are formed on display area DA of first substrate 10 (step 610), protective layer 18 is formed on display area DA (step 620). Referring to FIG. 4B, after sacrificial layer 14 and thin film encapsulation layer 16 are formed on second substrate 13 (step 630) and the sealing material is coated on the edge of thin film encapsulation layer 16 (step 640), the sealing material is baked to form sealing member 17 (step 650). In addition, after second substrate 13 is disposed on first substrate 10 so that sealing member 17 contacts first substrate 10 (step 660), second substrate 13 is separated from sacrificial layer 14 by irradiating the first laser (step 670). Referring to FIG. 4C, after sealing member 17 is melted by irradiating second laser beam LB to sealing member 17 (step 680), sealing member 17 is solidified to attach sealing member 17 to first substrate 10 (step 690).

Referring to FIG. 5, in organic light emitting diode (OLED) display device 300 of the third embodiment, thin film encapsulation layer 16 contacts protective layer 18, and protective layer 18 fills the internal space surrounded by thin film encapsulation layer 16 and sealing member 17, such that the interval between organic light emitting diode 20 and thin film encapsulation layer 16 is constantly maintained.

Protective layer 18 is formed only on display area DA or formed in an area that is larger than display area DA. In the second case, the width of protective layer 18 is not more than the distance between interior walls of sealing member 17. In addition, the height of the upper surface of protective layer 18 with respect to first substrate 10 is not more than the height of the upper surface of sealing member 17 of first substrate 10. Protective layer 18 may include at least one of silicon oxides, silicon nitrides, and aluminum oxides.

Figure 6A:
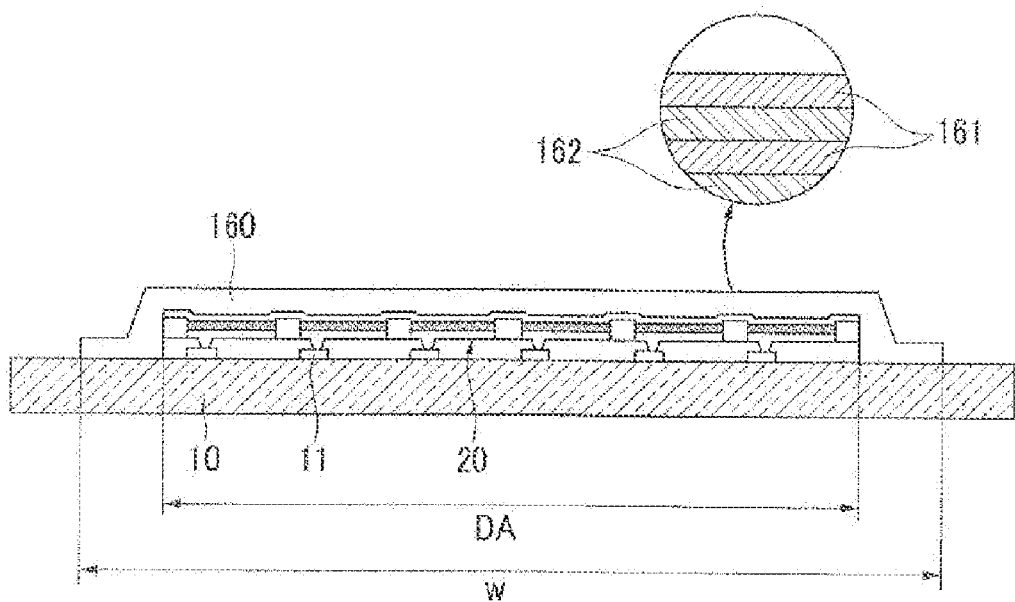
FIG. 6A to FIG. 6D are cross-sectional views that illustrate a method for manufacturing an organic light emitting diode (OLED) display device as a fourth embodiment constructed according to the principles of the present invention.
Figure 6B:
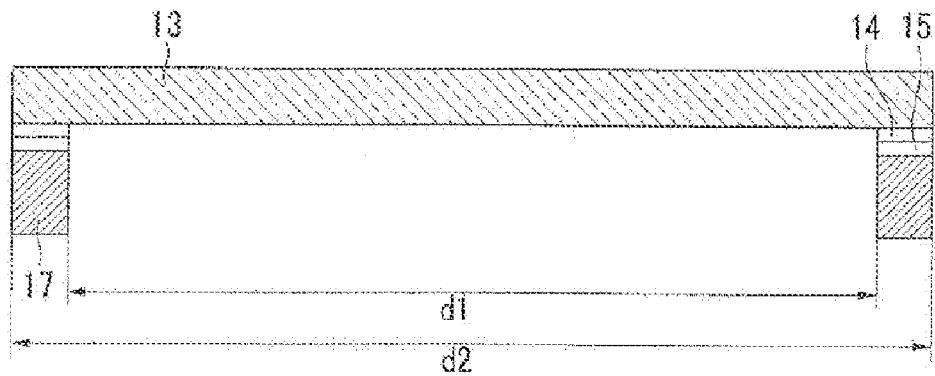
Figure 6C:
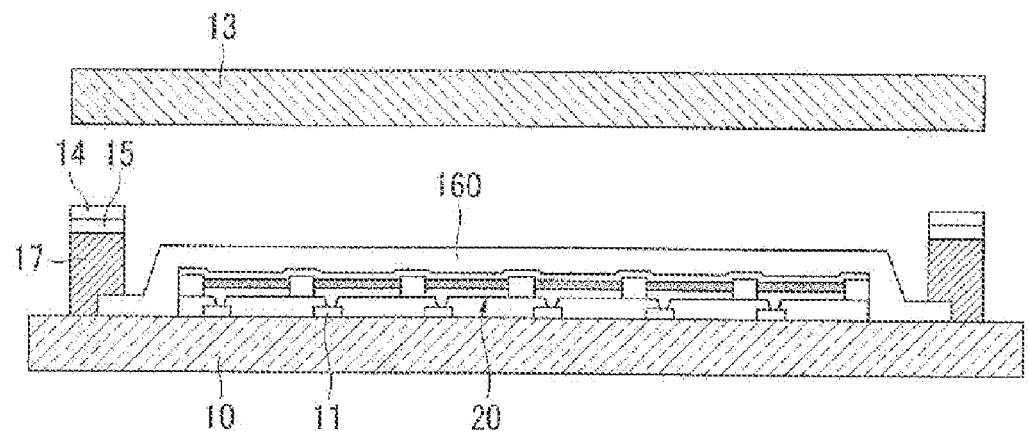
Figure 6D:
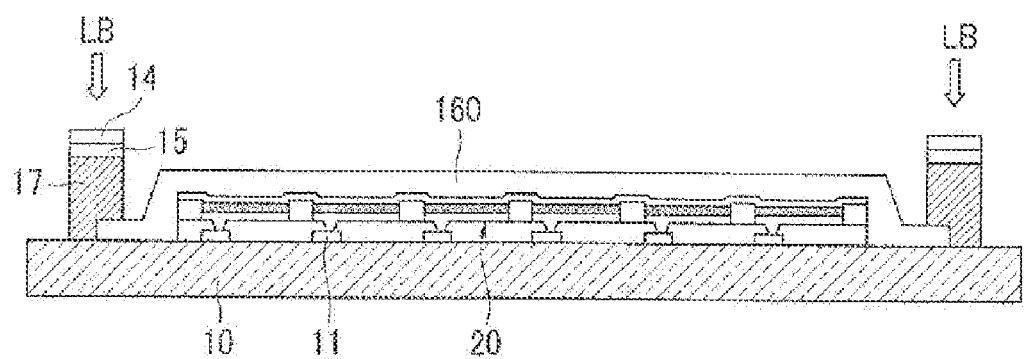
Figure 7:
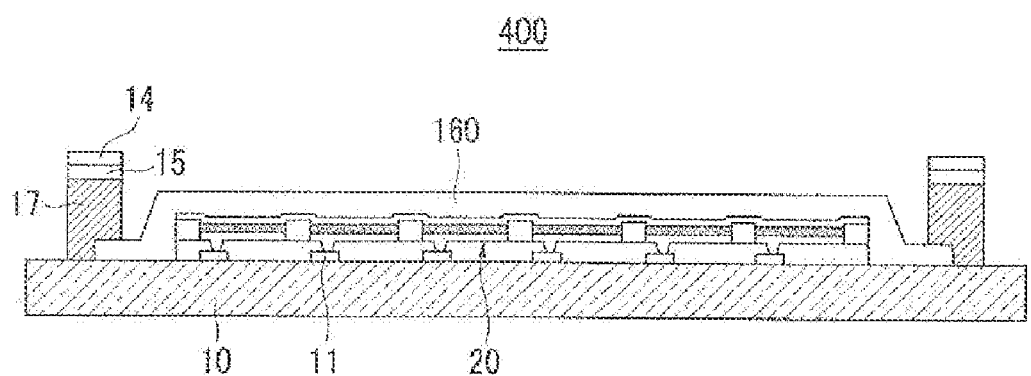
FIG. 7 is a cross-sectional view of an organic light emitting diode (OLED) display device constructed as the fourth embodiment according to the principles of the present invention.
Figure 12:
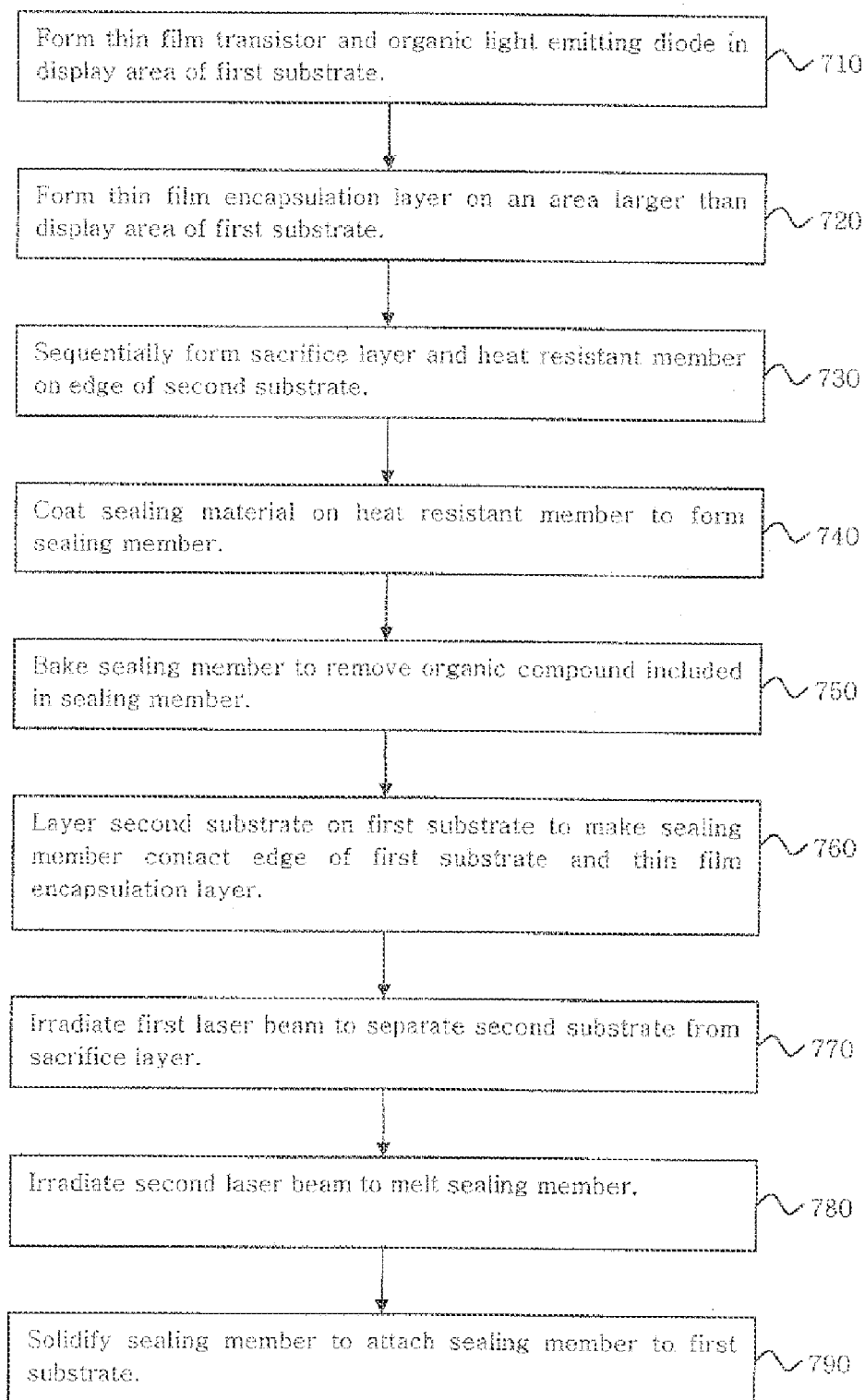
FIG. 12 is a flow chart illustrating the method for manufacturing the organic light emitting diode (OLED) display device as the third embodiment according to the principles of the present invention.

FIG. 6A to FIG. 6D are cross-sectional views that illustrate a manufacturing method of an organic light emitting diode (OLED) display device as a fourth embodiment according to the principles of the present invention, and FIG. 7 is a cross-sectional view of an organic light emitting diode (OLED) display device constructed as the fourth embodiment according to the principles of the present invention. FIG. 12 is a flow chart illustrating the manufacturing method of the organic light emitting diode (OLED) display device as the third embodiment according to the principles of the present invention.

Referring to FIG. 6A, a thin film transistor 11 and organic light emitting diode 20 are formed on display area DA of first substrate 10 (step 710). Thin film encapsulation layer 160 is formed by alternately layering one or more inorganic film 161 and organic film 162 on organic light emitting diode 20 (step 720). Thin film encapsulation layer 160 is formed in an area that is larger than display area DA.

Referring to FIG. 6B, second substrate 13 is prepared, Sacrificial layer 14 and heat resistant member 15 are formed on the edge of second substrate 13 (step 730). The constitution materials for sacrificial layer 14 and heat resistant member 15 are the same as that of the first embodiment. Sealing member 17 is formed by coating a sealing material that is composed of the mixture of an inorganic sealant and an organic compound on heat resistant member 15 (step 740), and the organic compound that is included in sealing member 17 is removed by baking sealing member 17 at the temperature of 400° C. to 450° C. (step 750).

In the fourth embodiment, sacrificial layer 14, heat resistant member 15 and sealing member 17 are formed at the edge of second substrate 13, and correspond to the non-display area of first substrate 10 later. In this case, distance d1 between the interior walls (see FIG. 6B) of sealing member 17 is smaller than width w (see FIG. 6A) of thin film encapsulation layer 160 that is measured along the same direction, and distance d2 between exterior walls (see FIG. 6B) of sealing member 17 is larger than width w (see FIG. 6A) of thin film encapsulation layer 160.

Referring to FIG. 6C, second substrate 13 is disposed on first substrate 10 so that sealing member 17 contacts the edge of first substrate 10 and thin film encapsulation layer 160 (step 760). Second substrate 13 is separated from sacrificial layer 14 by irradiating the first laser beam from the upper portion of second substrate 13 to second substrate 13 (step 770). Referring to FIG. 6D, after sealing member 17 is melted by irradiating second laser beam LB to sealing member 17 (step 780), sealing member 17 is solidified to attach sealing member 17 to first substrate 10 (step 790).

In the manufacturing method of the third embodiment and the manufacturing method of the fourth embodiment, the order of irradiation of the first laser beam and the second laser beam may be applied inversely.

Referring to FIG. 7, in organic light emitting diode (OLED) display device 400 of the fourth embodiment, sealing member 17 is formed on thin film encapsulation layer 160 along the edge of thin film encapsulation layer 160, and heat resistant member 15 and sacrificial layer 14 are disposed on thin film encapsulation layer 160. Since the distance between the exterior walls of sealing member 17 is larger than the width of thin film encapsulation layer 160, sealing member 17 seals the interface of first substrate 10 and thin film encapsulation layer 160 and the interface of the organic film and inorganic film that constitute thin film encapsulation layer 160 at the outside thereof.

In this case, since sealing member 17 is baked on second substrate 13 instead of first substrate 10, it is possible to remove the organic compound that is included in sealing member 17 at high efficiency. Accordingly, dense sealing member 17 can be formed by increasing the laser absorption ratio of sealing member 17, and sealing member 17 efficiently prevents the permeation of moisture and oxygen through the interface of the organic film and inorganic film at the edge of thin film encapsulation layer 160.

In organic light emitting diode (OLED) display devices 100, 200, 300, 400 of the first embodiment to the fourth embodiment, first substrate 10 may be formed of a ultra-thin film substrate for implementing a slim organic light emitting diode (OLED) display device or a flexible polymer film for implementing a flexible organic light emitting diode (OLED) display device. In all of two cases, first substrate 10 is formed of a transparent substrate.

Figure 8:
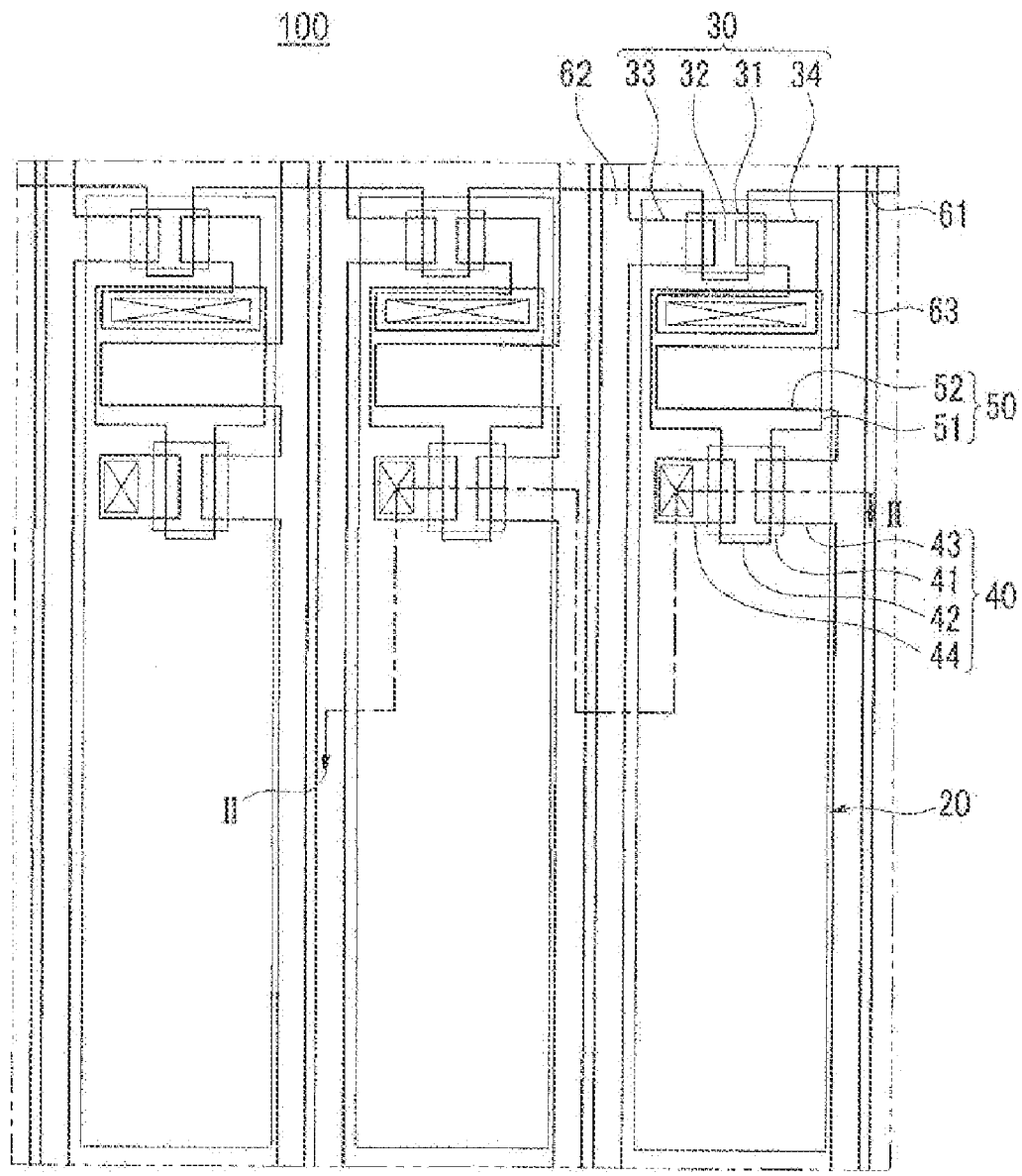
FIG. 8 is a layout view of a display area of the organic light emitting diode (OLED) display device of FIG. 2 as an embodiment constructed according to the principles of the present invention.
Figure 9:
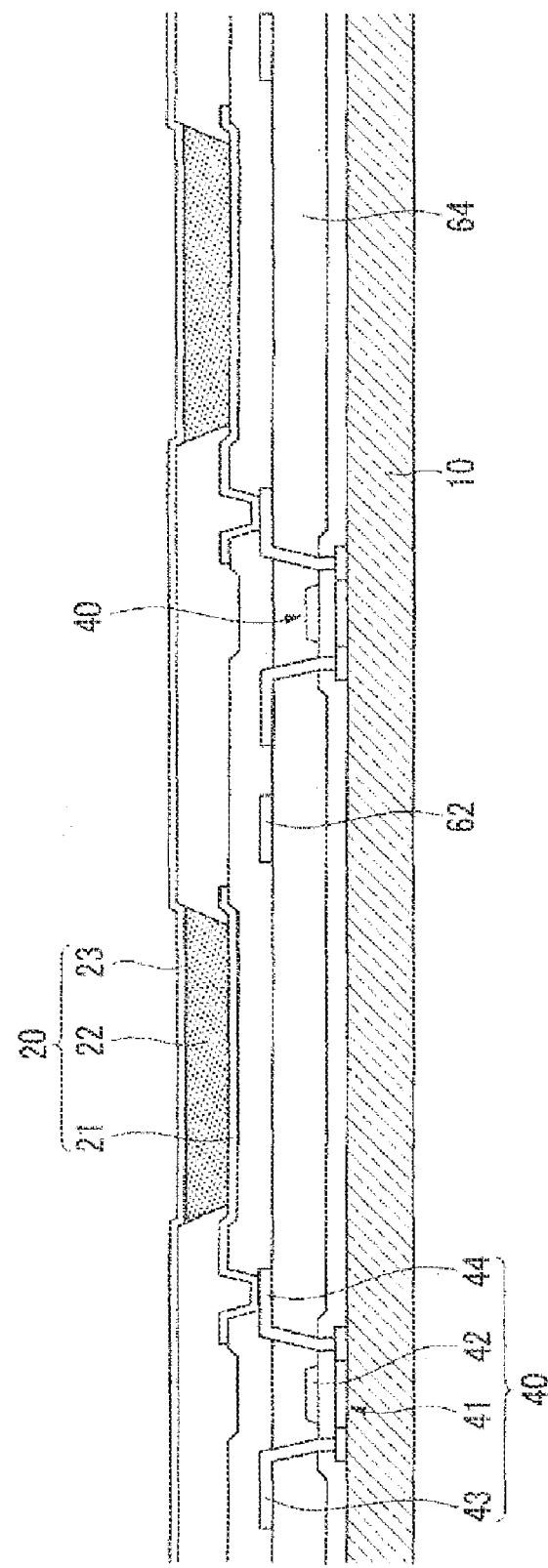
FIG. 9 is a cross-sectional view of the organic light emitting diode (OLED) that is taken along sectional line II-II of FIG. 8.

FIG. 8 is a layout view of a display area of the organic light emitting diode (OLED) display device of FIG. 2, and FIG. 9 is a cross-sectional view that is taken along line II-II of FIG. 8. The structure of the display area that will be described below is an example but the organic light emitting diode (OLED) display device of the first embodiment to the fourth embodiment is not limited to the following structure.

Referring to FIG. 8 and FIG. 9, organic light emitting diode (OLED) display 100 includes a switching thin film transistor 30 formed for each pixel, driving thin film transistor 40, capacitor 50 and organic light emitting diode 20. Organic light emitting diode (OLED) display 100 further includes a gate line 61 that is disposed along one direction, a data line 62 that crosses gate line 61 in an insulated state, and a common power source line 63.

Organic light emitting diode 20 includes pixel electrode 21, organic emission layer 22 and common electrode 23. Pixel electrode 21 may be a hole injection electrode (anode electrode), and common electrode 23 may be an electron injection electrode (cathode electrode). In this case, organic emission layer 22 is configured by hole injection layer (HIL), hole transport layer (HTL), emission layer, electron transport layer (ETL) and electron injection layer (ELL) that are sequentially layered from pixel electrode 21. In this case, at least one of the residual layers except for the emission layer may be omitted.

The holes and electrons are injected from pixel electrode 21 and common electrode 23 to organic emission layer 22 to form excitons, and when the excitons that are combined with the injected hole and electron fall from the exited state to the bottom state, light emission is implemented.

Pixel electrode 21 may be formed of a permissive conductive layer, and common electrode 23 may be formed of a reflective conductive layer. In this case, light that is emitted from organic emission layer 22 is reflected by common electrode 23 and discharged through pixel electrode 21 and first substrate 10 to the outside. This light emitting structure is called a rear side light emitting type. Pixel electrode 21 may include any one of ITO, IZO, $In_2O_3$ and ZnO, and common electrode 23 may include any one of silver Ag, aluminum Al, silver alloy and aluminum alloy.

Capacitor element 50 includes first capacitor plate 51 and second capacitor plate 52 that are disposed between interlayer insulating layers 64. Interlayer insulating layer 64 is formed of a dielectric material. The capacitance is determined by the charge that is accumulated in capacitor 50 and the voltage applied between first and second capacitors 51 and 52.

Switching thin film transistor 30 includes switching semiconductor layer 31, switching gate electrode 32, switching source electrode 33 and switching drain electrode 34. Driving thin film transistor 40 includes driving semiconductor layer 41, driving gate electrode 42, driving source electrode 43 and driving drain electrode 44.

Switching thin film transistor 30 is a switching element that selects the pixel that emits light. Switching gate electrode 32 is electrically connected to gate line 61. Switching source electrode 33 is electrically connected to data line 62. Switching drain electrode 34 is electrically separated from switching source electrode 33 and is electrically connected to first capacitor plate 51.

Driving thin film transistor 40 applies the driving voltage to pixel electrode 21 for performing light emission of organic emission layer 22 of the selected pixel. Driving gate electrode 42 is electrically connected to first capacitor plate 51, and driving source electrode 43 and second capacitor plate 52 are electrically connected to common power source line 63. Driving drain electrode 44 is electrically connected to pixel electrode 21 of organic light emitting diode 20 through the contact hole.

By the above structure, switching thin film transistor 30 is operated by the scan voltage that is applied to gate line 61 and transfers the data voltage that is applied to data line 62 to driving thin film transistor 40. The voltage that corresponds to a difference in the common voltage that is applied from common power line 63 to driving thin film transistor 40 and the data voltage that is transferred from switching thin film transistor 30 is stored in capacitor element 50, and the current that corresponds to the voltage that is stored in capacitor element 50 flows through driving thin film transistor 40 to organic light emitting diode 20 to allow organic light emitting layer 22 to emit light.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: First substrate
11: Thin film transistor
13: Second substrate
14: Sacrificial layer
15: Heat resistant member
16: Thin film encapsulation layer
17: Sealing member
18: Protective layer
20: Organic light emitting diode
21: Pixel electrode
22: Organic emission layer
23: Common electrode

What is claimed is:

1. A manufacturing method of an organic light emitting diode (OLED) display device, the method comprising:
preparing a first substrate and a second substrate and forming a thin film transistor and an organic light emitting diode in a display area of the first substrate;
forming a thin film encapsulation layer having a layered structure composed of alternating layers of an organic film and an inorganic film on one substrate of the first substrate and the second substrate;
forming a sealing member by coating a sealing material that includes an inorganic sealant and an organic compound onto an outer peripheral edge of the second substrate, excluding a center section of the second substrate;
removing the organic compound of the sealing member by baking the sealing member;
layering the second substrate on the first substrate so that the sealing member contacts the first substrate; and
dissolving the sealing member with a laser beam, solidifying the sealing member, attaching the sealing member to the first substrate, and removing the second substrate from the sealing member.

2. The method of claim 1, further comprising:
wherein the thin film encapsulation layer is formed on an entirety of one surface of the second substrate,
forming a sacrificial layer between the second substrate and the thin film encapsulation layer.

3. The method of claim 2, wherein:
the second substrate, the sacrificial layer and the thin film encapsulation layer are collectively formed in an area that is larger than the display area.

4. The method of claim 3, wherein:
the sacrificial layer has a heat resistant temperature that is no less than the baking temperature of the sealing member and includes at least one of ceramic oxides, ceramic nitrides, organic polymers and metal.

5. The method of claim 3, further comprising:
forming a heat resistant member between the sacrificial layer and the thin film encapsulation layer.

6. The method of claim 5, wherein:
the heat resistant member has a heat resistant temperature is no less than the baking temperature of the sealing member and includes at least one of polyimide, polyphenylensulphide, polyethersulfone and polyethyleneterephthalate.

7. The method of claim 3, wherein:
the sealing member is formed at an edge of the thin film encapsulation layer on the thin film encapsulation layer.

8. The method of claim 3, wherein:
after the organic light emitting diode is formed on the first substrate, covering the display area with a protective layer.

9. The method of claim 8, wherein:
the protective layer contacts the thin film encapsulation layer after the sealing member is attached with the first substrate, and is formed in an area that is the same in size as the display area or that is larger in size than the display area.

10. The method of claim 2, wherein:
the laser beam includes a first laser beam that is irradiated onto the sacrificial layer to separate the second substrate from the sacrificial layer and a second laser beam that is irradiated onto the sealing member and dissolves the sealing member.

11. The method of claim 1, further comprising:
wherein the thin film encapsulation layer is formed in an area that is larger in size than the display area on the organic light emitting diode,
forming a sacrificial layer and heat resistant member between the second substrate and the sealing member.

12. The method of claim 11, wherein:
a distance between interior walls of the sealing member is smaller than a width of the thin film encapsulation layer, and a distance between exterior walls of the sealing member is larger than the width of the thin film encapsulation layer.

13. The method of claim 11, wherein:
the laser beam includes a first laser beam that is irradiated onto the sacrificial layer to separate the second substrate from the sacrificial layer and a second laser beam that is irradiated onto the sealing member to dissolve the sealing member.

14. The method of claim 1, wherein:
the baking temperature of the sealing member is approximately 400° C. to approximately 450° C.

15. An organic light emitting diode (OLED) display device, comprising:
a first substrate comprising a display area in which an organic light emitting diode is formed;
a thin film encapsulation layer disposed at an external side of the organic light emitting diode along a thickness direction of the first substrate, said thin film encapsulation layer comprising a layering structure composed of alternating layers of at least one organic film and at least one inorganic film;
a sealing member contacting the thin film encapsulation layer and disposed at the external side of the organic light emitting diode along a plane that is parallel to a surface direction of the first substrate and excluding a center portion of the first substrate; and
a sacrificial layer disposed on an upper portion of a selected one of the thin film encapsulation layer and the sealing member.

16. The organic light emitting diode (OLED) display device of claim 14, wherein:
the sealing member is formed on the first substrate, and the thin film encapsulation layer is disposed to be spaced apart from the organic light emitting diode on the sealing member.

17. The organic light emitting diode (DEED) display device of claim 15, wherein:
the sacrificial layer is disposed on the thin film encapsulation layer while having an area that is the same as an area of thin film encapsulation layer.

18. The organic light emitting diode (OLED) display device of claim 16, further comprising:
a heat resistant member disposed between the sacrificial layer and the thin film encapsulation layer while having an area that is the same as the area of the thin film encapsulation layer.

19. The organic light emitting diode (OLED) display device of claim 15, further comprising:
a protective layer disposed in an internal space that is surrounded by the thin film encapsulation layer and the sealing member and the first substrate, wherein the protective layer contacts the organic light emitting diode.

20. The organic light emitting diode (OLED) display device of claim 14, wherein:
the thin film encapsulation layer is formed to contact the organic light emitting diode on the first substrate, and the sealing member covers an edge of the thin film encapsulation layer.

21. The organic light emitting diode (OLED) display device of claim 19, wherein:
the sacrificial layer is disposed on the sealing member while having an area that is the same as an area of the sealing member.

22. The organic light emitting diode (OLED) display device of claim 20, further comprising:
a heat resistant member that is disposed between the sacrificial layer and the sealing member while having an area that is the same as the area of the sealing member.

23. The organic light emitting diode (OLED) display device of claim 19, wherein:
the thin film encapsulation layer is formed in an area that is larger than the display area,
the distance between interior walls of the sealing member is smaller than the width of the thin film encapsulation layer, and the distance between exterior walls of the sealing member is larger than the width of the thin film encapsulation layer.

* * * * *